(12) United States Patent
Abdallah et al.

(10) Patent No.: US 7,416,834 B2
(45) Date of Patent: Aug. 26, 2008

(54) ANTIREFLECTIVE COATING COMPOSITIONS

(75) Inventors: David J. Abdallah, Bernardsville, NJ (US); Ralph R. Dammel, Flemington, NJ (US)

(73) Assignee: AZ Electronic Materials USA Corp., Somerville, NJ (US)

( * ) Notice: Subject to any disclaimer, the term of this patent is extended or adjusted under 35 U.S.C. 154(b) by 0 days.

(21) Appl. No.: 11/527,862

(22) Filed: Sep. 27, 2006

(65) Prior Publication Data

US 2008/0076059 A1    Mar. 27, 2008

(51) Int. Cl.
*G03C 1/00* (2006.01)
(52) U.S. Cl. .................. 430/270.1; 438/636; 438/72
(58) Field of Classification Search .............. 428/447; 430/270.1; 438/107; 556/423
See application file for complete search history.

(56) References Cited

U.S. PATENT DOCUMENTS

| | | | | |
|---|---|---|---|---|
| 3,474,054 | A | 10/1969 | White | 427/385.5 |
| 4,113,696 | A * | 9/1978 | Williams et al. | 556/423 |
| 4,200,729 | A | 4/1980 | Calbo | 525/398 |
| 4,251,665 | A | 2/1981 | Calbo | 548/215 |
| 4,491,628 | A | 1/1985 | Ito et al. | 430/176 |
| 5,187,019 | A | 2/1993 | Calbo et al. | 428/524 |
| 5,234,990 | A | 8/1993 | Flaim et al. | 524/609 |
| 5,350,660 | A | 9/1994 | Urano et al. | 430/176 |
| 5,843,624 | A | 12/1998 | Houlihan et al. | 430/296 |
| 6,042,992 | A | 3/2000 | Dammel et al. | 430/325 |
| 6,114,085 | A * | 9/2000 | Padmanaban et al. | 430/270.1 |
| 6,447,980 | B1 | 9/2002 | Rahman et al. | 430/270.1 |
| 6,723,488 | B2 | 4/2004 | Kudo et al. | 430/270.1 |
| 6,790,587 | B1 | 9/2004 | Feiring et al. | 430/270.1 |
| 6,818,258 | B2 | 11/2004 | Kaneko et al. | 427/553 |
| 6,849,377 | B2 | 2/2005 | Feiring et al. | 430/270.1 |
| 6,866,984 | B2 | 3/2005 | Jung et al. | 430/270.1 |
| 6,916,590 | B2 | 7/2005 | Kaneko et al. | 430/270.1 |
| 2002/0188082 | A1 * | 12/2002 | Nakata et al. | 525/332.4 |
| 2004/0121260 | A1 | 6/2004 | Nakamura et al. | 430/270.1 |
| 2004/0247900 | A1 * | 12/2004 | Ogihara et al. | 428/447 |
| 2005/0058929 | A1 | 3/2005 | Kennedy et al. | 430/270.1 |
| 2005/0118749 | A1 * | 6/2005 | Sakamoto et al. | 438/107 |
| 2005/0202340 | A1 * | 9/2005 | Houlihan et al. | 430/270.1 |
| 2005/0277058 | A1 * | 12/2005 | Iwabuchi et al. | 430/270.1 |
| 2005/0277274 | A1 | 12/2005 | Karkkainen | 438/496 |
| 2005/0282091 | A1 * | 12/2005 | Hatakeyama | 430/323 |
| 2006/0024613 | A1 * | 2/2006 | Otozawa et al. | 430/270.1 |
| 2006/0058468 | A1 | 3/2006 | Wu et al. | 525/386 |
| 2006/0177774 | A1 | 8/2006 | Abdallah et al. | 430/311 |
| 2007/0298349 | A1 | 12/2007 | Zhang et al. | 430/270.1 |
| 2008/0008954 | A1 | 1/2008 | Abdallah et al. | 430/270.1 |

FOREIGN PATENT DOCUMENTS

| | | | |
|---|---|---|---|
| JP | 2002267802 A | * 9/2002 | |
| WO | WO 01/11429 A1 | 2/2001 | |
| WO | WO 01/98834 A1 | 12/2001 | 430/270.1 |
| WO | WO 03/058345 A2 | 7/2003 | |
| WO | WO 2006/054173 A1 | 5/2006 | |

OTHER PUBLICATIONS

Whittaker, Andrew K., et al. High-RI Resist Polymers for 193 nm Immersion Lithography. Advances in Resist Technology and Processing XXII, Proceedings of SPIE vol. 5753, pp. 827-835. Bellingham, WA 2005.*
Whittaker, Andrew K., et al. High-RI Resist Polymers for 193 nm Immersion Lithography. Advances in Tesist Technology and Processing XXIII, Proceeding of SPIE vol. 5753, pp. 827-835. Bellingham, WA 2005.*
Baran, T., et al. Anionic polymerization of norbornene trisulfide (exo -3,4,5-trithia-tricyclo [5.2.1.02.6] decane). Journal of Polymer Science (1984), 22(5), pp. 1085-1095.*
ChemFiles—Aldrich Catalog vol. 4, No. 1 (2004).
R. Dammel et al., "Modeling of Bottom Anti-Reflection layers: Sensitivity to Optical Constants", SPIE vol. 2724, pp. 754-pp. 769 (1996).
S. Kodama et al., "Synthesis of Novel Fluoropolymer for 157nm Photoresists by Cyclo-polymerization", SPIE vol. 4690, pp. 76-pp. 83 (2002).
N. Matsuzawa et al., "Numerical Investigations on Requirements for BARC Materials for Hyper NA Immersion Lithography", Journal of Photopolymer Science and Technology vol. 18, No. 5, pp. 587-pp. 592 (2005).
M. Switkes et al., "Immersion Liquids for Lithography in the Deep Ultraviolet", SPIE vol. 5040, pp. 690-pp. 694 (2003).
A. Whittaker et al., "High RI Resist Polymers for 193 nm Immersion Lithography", SPIE vol. 5753, pp. 827-pp. 835 (2005).

* cited by examiner

*Primary Examiner*—Cynthia H. Kelly
*Assistant Examiner*—Ponder N Thompson Rummel
(74) *Attorney, Agent, or Firm*—Sangya Jain

(57) ABSTRACT

The present invention relates to a spin-on antireflective coating composition for a photoresist comprising a polymer, a crosslinking compound and a thermal acid generator, where the polymer comprises at least one functional moiety capable of increasing the refractive index of the antireflective coating composition to a value equal or greater than 1.8 at exposure radiation used for imaging the photoresist and a functional moiety capable of absorbing exposure radiation used for imaging the photoresist. The invention further relates to a process for imaging the antireflective coating of the present invention.

22 Claims, 5 Drawing Sheets

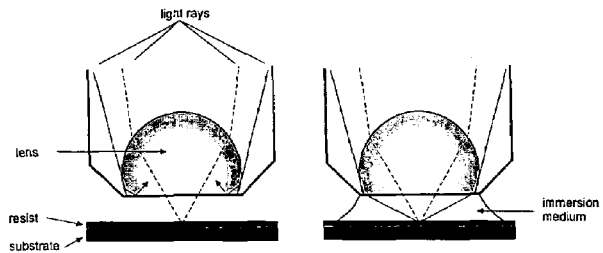
Figure 1: Difference in the optical path of light rays entering at the extreme edge of a lens for air and an immersion medium of higher refractive index.
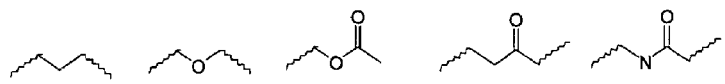
∽∽∽ are points of attachment to other groups
Figure 2: Examples of connecting group, Y.
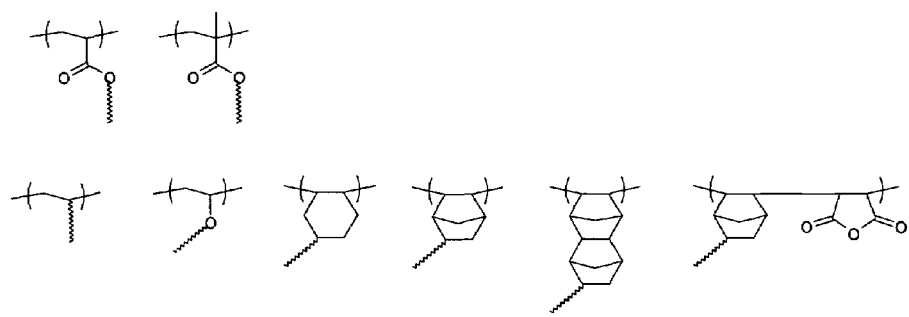
∽∽∽ are points of attachment to other groups
Figure 3: Examples of the backbone unit W.

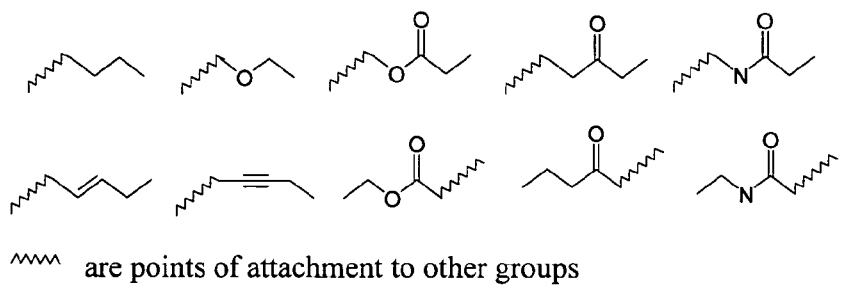
ᴡᴡᴡ are points of attachment to other groups
Figure 4: Examples of end group, X.
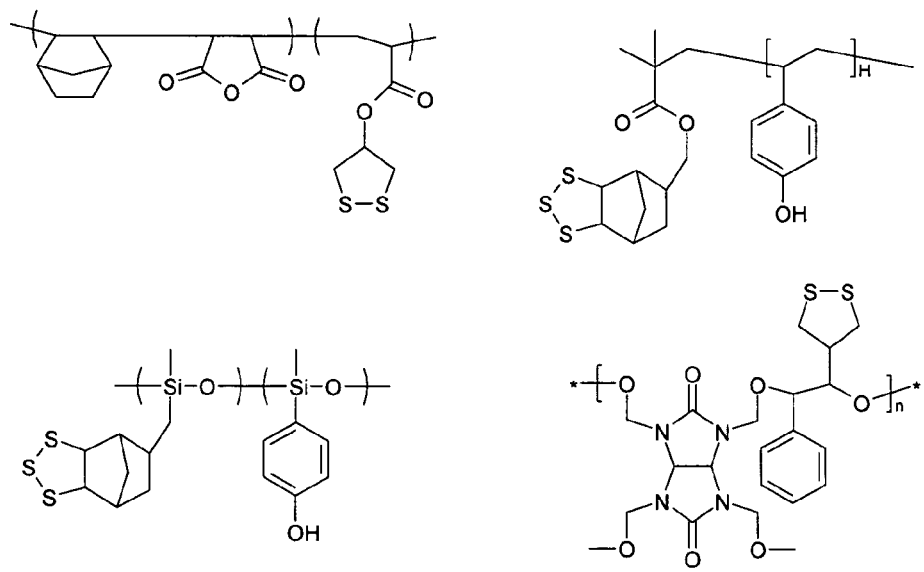
Figure 5: Examples of polymers.

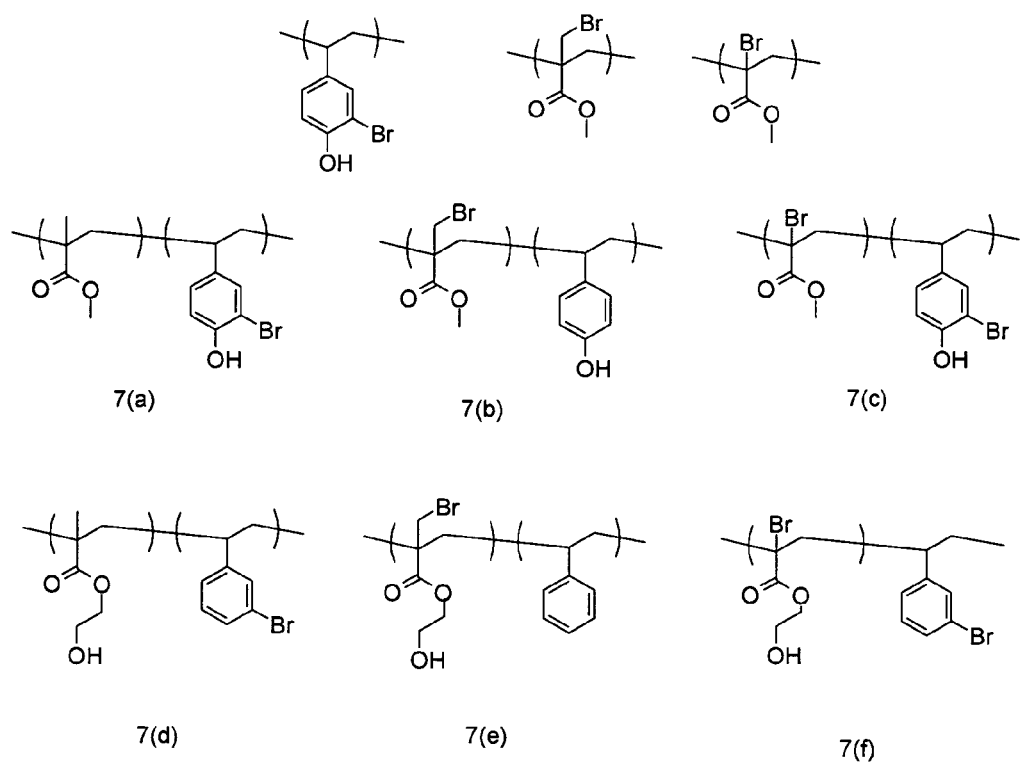
Figure 6: Examples of halogenated monomeric units and polymeric units.

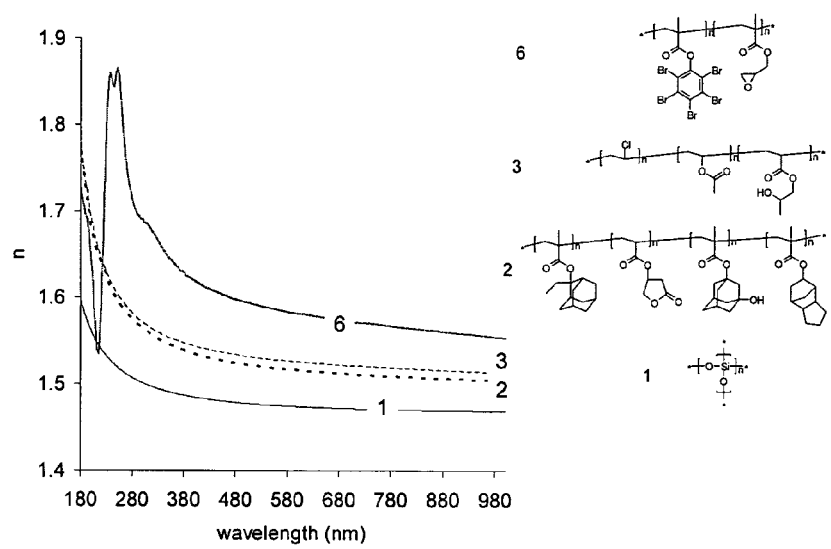
Figure 7: Examples of Refractive indices of various polymers as a function of wavelength.

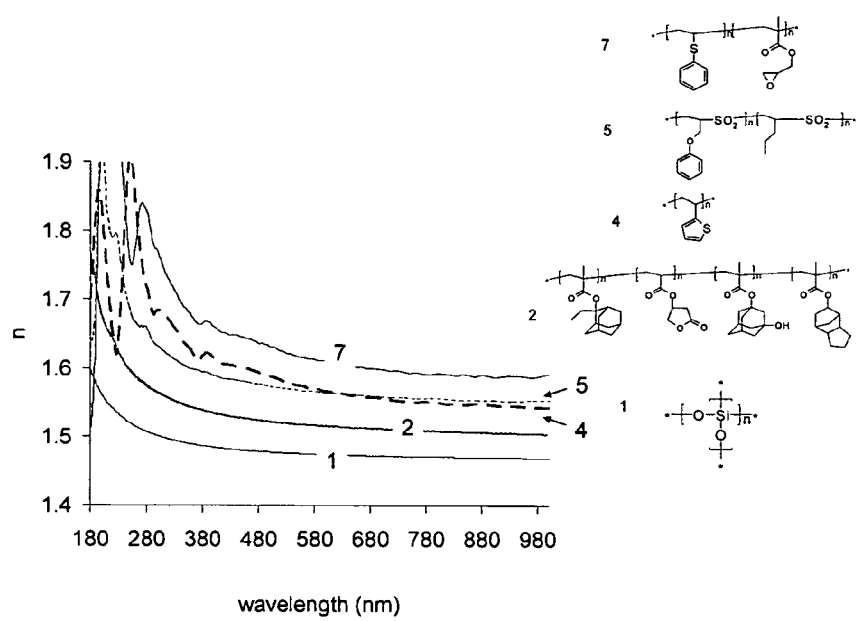
Figure 8: Further Examples of Refractive indices of various polymers as a function of wavelength.

ANTIREFLECTIVE COATING COMPOSITIONS

FIELD OF THE INVENTION

The present invention relates to an absorbing antireflective coating composition comprising a polymer with a refractive index greater than 1.8, a crosslinking compound and a thermal acid generator. The invention also relates to a process for forming an image using the antireflective coating composition. The process is useful for imaging photoresists using radiation in the deep ultraviolet (uv) region, especially for immersion lithography.

BACKGROUND OF INVENTION

Photoresist compositions are used in microlithography processes for making miniaturized electronic components such as in the fabrication of computer chips and integrated circuits. Generally, in these processes, a thin coating of film of a photoresist composition is first applied to a substrate material, such as silicon wafers used for making integrated circuits. The coated substrate is then baked to evaporate any solvent in the photoresist composition and to fix the coating onto the substrate. The photoresist coated on the substrate is next subjected to an image-wise exposure to radiation.

The radiation exposure causes a chemical transformation in the exposed areas of the coated surface. Visible light, ultraviolet (UV) light, electron beam and X-ray radiant energy are radiation types commonly used today in microlithographic processes. After this image-wise exposure, the coated substrate is treated with a developer solution to dissolve and remove either the radiation exposed (positive photoresist) or the unexposed areas of the photoresist (negative photoresist).

Positive working photoresists when they are exposed image-wise to radiation have those areas of the photoresist composition exposed to the radiation become more soluble to the developer solution while those areas not exposed remain relatively insoluble to the developer solution. Thus, treatment of an exposed positive-working photoresist with the developer causes removal of the exposed areas of the coating and the formation of a positive image in the photoresist coating. Again, a desired portion of the underlying surface is uncovered.

Negative working photoresists when they are exposed image-wise to radiation, have those areas of the photoresist composition exposed to the radiation become insoluble to the developer solution while those areas not exposed remain relatively soluble to the developer solution. Thus, treatment of a non-exposed negative-working photoresist with the developer causes removal of the unexposed areas of the coating and the formation of a negative image in the photoresist coating. Again, a desired portion of the underlying surface is uncovered.

Photoresist resolution is defined as the smallest feature which the photoresist composition can transfer from the photomask to the substrate with a high degree of image edge acuity after exposure and development. In many leading edge manufacturing applications today, photoresist resolution on the order of less than 100 nm is necessary. In addition, it is almost always desirable that the developed photoresist wall profiles be near vertical relative to the substrate, photoresist images are free of residues, have good depth of focus and the photoresist have good long term and short term stability. Good lithographic properties are important for the photoresist. Such demarcations between developed and undeveloped areas of the photoresist coating translate into accurate pattern transfer of the mask image onto the substrate. This becomes even more critical as the push toward miniaturization reduces the critical dimensions on the devices.

The trend towards the miniaturization of semiconductor devices has led to the use of new photoresists that are sensitive at lower and lower wavelengths of radiation and has also led to the use of sophisticated multilevel systems, such as antireflective coatings, to overcome difficulties associated with such miniaturization.

Photoresists sensitive to short wavelengths, between about 100 nm and about 300 nm, are often used where subhalfmicron geometries are required. Particularly preferred are deep uv photoresists sensitive at below 200 nm, e.g. 193 nm and 157 nm, comprising non-aromatic polymers, a photoacid generator, optionally a dissolution inhibitor, and solvent.

The use of highly absorbing antireflective coatings in photolithography is a useful approach to diminish the problems that result from back reflection of radiation from highly reflective substrates. The bottom antireflective coating is applied on the substrate and then a layer of photoresist is applied on top of the antireflective coating. The photoresist is exposed imagewise and developed. The antireflective coating in the exposed area is then typically dry etched using various etching gases, and the photoresist pattern is thus transferred to the substrate.

In order to further improve the resolution and depth of focus of photoresists, immersion lithography is a technique that has recently been used to extend the resolution limits of deep uv lithography imaging. In the traditional process of dry lithography imaging, air or some other low refractive index gas, lies between the lens and the wafer plane. This abrupt change in refractive index causes rays at the edge of the lens to undergo total internal reflection and not propagate to the wafer (FIG. 1). In immersion lithography a fluid is present between the objective lens and the wafer to enable higher orders of light to participate in image formation at the wafer plane. In this manner the effective numerical aperture of the optical lens (NA) can be increased to greater than 1, where $NA_{wet}=n_i \sin \theta$, where $NA_{wet}$ is the numerical aperture with immersion lithography, $n_i$ is refractive index of liquid of immersion and $\sin \theta$ is the angular aperture of the lens. Increasing the refractive index of the medium between the lens and the photoresist allows for greater resolution power and depth of focus. This in turn gives rise to greater process latitudes in the manufacturing of IC devices. The process of immersion lithography is described in 'Immersion liquids for lithography in deep ultraviolet' Switkes et al. Vol. 5040, pages 690-699, Proceedings of SPIE, and incorporated herein by reference. The numerical aperture of the lens has been increasing to values of greater than 1, e.g. up to 1.4 and greater, so that features of less than 50 nm may be resolved successfully.

In addition to increasing the NA of the lens, immersion lithography requires a photoresist with higher refractive index (n) than one for dry lithography, typically of the order of 1.8 and greater at the imaging exposure wavelength. The complex index of refraction ($\tilde{n}$) consists of n, the refractive index which is the phase velocity, and k, the extinction coefficient which is the amount of absorption loss when the electromagnetic wave propagates through the material. Both n and k are dependent on the frequency (wavelength) and are known by the equation, $\tilde{n}=n-ik$. In increasing the NA beyond 1.3, immersion lithography requires the immersion fluid to have a refractive index greater than water and the photoresist to also have higher refractive index than photoresists used in dry lithography to avoid problems with polarization, linearity, variations in critical dimension through pitch, which are diffraction related problems. A higher refractive index is preferred, but material constraints in lens materials and high refractive index fluids have limited the expectation for photoresist refractive index values to near 1.9 at the imaging exposure wavelength. Photoresists used in dry lithography typically have a refractive index of 1.7. Photoresists having a refractive index of 1.9 and greater are being developed for immersion lithography.

A combination of immersion lithography and high refractive index photoresists coated over one or more antireflective coatings provides the imaging of even smaller features with resolution much below 40 nm. However, in order to prevent the deterioration of photoresist image quality from reflection from the substrate, it is desirable to reduce reflectivity to less than 1%. Unlike a single layer bottom antireflective coating, multilayer bottom antireflective coatings are capable of suppressing reflectivity through a wide range of incident angles. The typical trilayer process is an example of a dual layer antireflection scheme which, for example, consists of upper silicon containing bottom antireflective coating and a carbon rich underlayer bottom antireflective coating with the photoresist coated over the upper layer bottom antireflective coating. With multilayer bottom antireflective coatings, reflectivity of less than 1% is achievable in immersion lithography. One general characteristic to multi-layer antireflection coatings is an increase in (k) value from the upper layer to the bottom layer regardless of the elemental composition of the layers. The lower layer of bottom antireflective coating is highly absorbing and the overall reflectivity control is attributed to a combination of absorption predominantly in the lower layer combined with interference effects predominately in the upper layer. With a suitable low absorption coefficient (k) value and matched index of refraction to the photoresist for the upper layer, it also acts as a good light transport layer into the lower absorbing layer. Thus, absorption has to be low in the upper antireflection layer and the refractive index should be equal to or higher than the photoresist for obtaining proper interference effects through a wide range of angles and to maximize transmission from the photoresist into this layer. The higher refractive index in the upper antireflective coating then requires that any antireflective layer beneath it have a similar refractive index value to maximize transmittance into the lower, more absorbing, antireflective layers.

Antireflective coatings that are spin castable are preferred over those that are vapor deposited, since vapor deposited films require expensive vacuum equipment and tend to coat conformally. Increasing the refractive index of a spin-on bottom antireflective coating to match or exceed the refractive index of the photoresist while maintaining other lithographic properties has proved to be difficult, especially in upper layer bottom antireflective coating which have low absorption values. So far, conventional low absorption bottom antireflective coatings have a refractive index of around 1.7 for organic layers and around 1.6 for hybrid silicon containing materials.

In addition to antireflection properties, advanced bottom antireflective coatings also provide enhanced pattern transfer properties to the substrate. In a single layer pattern transfer process, high etch rate bottom antireflective coatings preserve photoresist film thickness so it can act as a thicker mask in transferring the image to the substrate. In multiple layer pattern transfer process, antireflection coatings act as masking layers themselves with low etch rates during etching of the underlying layer, known as hard mask. For example, by inserting a silicon rich antireflective layer beneath the photoresist and another organic antireflective layer beneath the silicon layer the vertical pattern can be amplified through to the substrate to improve the selectivity between elementally different layers as each layer acts as a mask for the next layer. Thus, there is additionally a need for a bottom antireflective coating which has well defined etch characteristics for different types of bottom antireflective coatings. Integrating antireflection properties with hard mask is becoming increasingly useful at many lithography layers.

Therefore, there is a need for a bottom antireflective coating which has the appropriate etch control and is capable of adequately preventing reflection for use in immersion lithography where a high NA lens is used. In immersion lithography, the antireflective film having optimum lithographic parameters of film thickness, absorption, reflectivity, etc. can be achieved by increasing the refractive index to closely match or exceed the refractive index of the photoresist which is coated over the antireflective coating.

The present invention provides for a novel spin-on antireflective coating composition which is coated below a photoresist and is capable of having a refractive index of greater than or equal to 1.8 at the imaging exposure radiation. The increase in refractive index is achieved by adding functionalities to the polymer which increase the refractive index at the exposure wavelength. The novel antireflective coating is used in a process for imaging the photoresist using immersion lithography.

SUMMARY OF THE INVENTION

The present invention relates to a spin-on antireflective coating composition for a photoresist comprising a polymer, a crosslinking compound and a thermal acid generator, where the polymer comprises at least one functional moiety capable of increasing the refractive index of the antireflective coating composition to a value equal to or greater than 1.8 at the exposure radiation used for imaging the photoresist and a functional moiety capable of absorbing exposure radiation used for imaging the photoresist. In the antireflective composition the functional moiety capable of increasing the refractive index is selected from —$(S)_n$—, —$SO_2$—, —Br, and —I, where n is an integer. The invention further relates to a process for imaging the antireflective coating of the present invention.

BRIEF DESCRIPTION OF THE DRAWINGS

FIG. 1 shows the difference in the optical path of light rays entering at the extreme edge of a lens for air and an immersion medium of higher refractive index.

FIG. 2 describes some examples of connecting group, Y.

FIG. 3 describes some examples of the backbone unit, W.

FIG. 4 describes some examples of end group, X.

FIG. 5 describes examples of polymers.

FIG. 6 describes examples of halogenated monomeric units and polymeric units.

FIG. 7 shows examples of refractive indices of various polymers as a function of wavelength.

FIG. 8 shows more examples of refractive indices of various polymers as a function of wavelength.

DETAILED DESCRIPTION OF THE INVENTION

The present invention relates to a novel spin-on antireflective coating composition and a process for using it in forming an image. The spin-on antireflective coating composition which is coated below a photoresist is capable of having a refractive index of greater than or equal to 1.8 at the imaging exposure wavelength. The antireflective composition comprises a polymer with a refractive index greater than or equal to 1.8 at the imaging exposure wavelength, a crosslinking compound and a thermal acid generator. The polymer of the antireflective coating composition is capable of being crosslinked and comprises at least one functionality capable of increasing the refractive index and at least one functionality capable of absorbing the exposure radiation used to expose the photoresist. The antireflective coating composition is used to form a film below the photoresist and the photoresist is imaged using immersion lithography, especially where the numerical aperture of the lens is greater than 1.2, and the exposure radiation is below 300 nm.

The polymer of the antireflective coating comprises a functionality capable of increasing the refractive index, a functionality capable of absorbing the exposure radiation used to expose the photoresist and functionality capable of crosslinking the polymer with the crosslinking compound in the presence of a thermally generated acid. The polymer can additionally comprise a functionality that imparts hard mask qualities (lowers the etch rate) or increases the etch rate. Functionalities that increase the refractive index are atoms or groups that can be polarized or have high atomic numbers, such as thiol, sulfide, sulfone, thiocyanates, thionyl, and halides such as chloro, bromo and iodo. For example, if the hydrogens in a typical organic polymer are replaced by halogens, a material with a higher refractive index will be obtained. High density materials also tend to have higher refractive indices, such as dense polymers. Functionalities that are absorbing can be any appropriate chromophore that absorbs radiation used to expose the photoresist, e.g. for 193 nm and below exposure, monoaromatic ring functionalites are useful, such as substituted or unsubstituted phenyl. Functionalities that are capable of being crosslinked by a thermally generated acid are generally known, such as phenolic, epoxy, hydroxyl, carboxylic acid, isocycanate, etc.

Polymers used in photoresists with increased refractive index are known, however, these polymers for photoresists are not absorbing. Polymers useful for antireflective coatings must both increase the refractive index and be absorbing at the radiation used to expose the photoresist. In immersion lithography where the antireflective coating composition has a high refractive index (n) to reduce reflectivity, the absorption (k) of the composition does not necessarily have to be high. Reflectivity is related to the refractive indices and absorptions of the photo(resist) and bottom antireflective coating (BARC) as given in Equation 1, where R is the reflectivity, n is the refractive index and k is the imaginary component of the refractive index known as extinction coefficient, which is related to the absorption coefficient $\alpha(\lambda)$ as a function of wavelength ($\lambda$), by $k=\alpha(\lambda)/(4\pi)$. It is desirable to have a reflectivity of less than 1%, preferably less than 0.35%.

$$R = \frac{(n_{resist} - n_{BARC})^2 + (k_{resist} - k_{BARC})^2}{(n_{resist} + n_{BARC})^2 + (k_{resist} + k_{BARC})^2} \quad \text{Equation 1}$$

Conventional photoresists such as those used in dry lithography, have a refractive index of around 1.7 at the exposure wavelength, and the conventional antireflective coatings coated below these photoresists have a refractive index ranging from 1.5 to 1.7. Conventional antireflective coatings are typically polyacrylates, polyolefins, polyethers, polyesters, and polysiloxanes. In immersion lithography reflectivity is reduced by keeping the difference between the n and k values of the photoresist and BARC as low as possible and the actual values of n for the photoresist and BARC as high as possible.

Thus, in immersion lithography an n value for the antireflective coating of greater than 1.8 is desirable and a k value on the lower side is desirable. Thus in one embodiment of the present antireflective coating composition the refractive index (n) is greater than 1.8, and the absorption (k) is in the range of about 0.1 to about 0.3, or in the range of about 0.1 to about 0.25. The film thickness of the antireflective coatings can range from about 10 nm to about 300 nm. The functionality that provides an increase in the refractive index of the polymer are elements with high atomic numbers and can also be polarizable groups, such as —(S)$_n$—, —SO$_2$—, —Cl, —Br, and —I, where n is a positive integer. These functionalities may be present in the backbone of the polymer or pendant from the polymer. Increasing the amount of these functionalities will increase the refractive index to obtain a value of 1.8 or greater.

The polymer of the antireflective coating composition can comprise the monomeric unit with sulfur groups in the backbone as shown in Structure 1, where $R_1'$ is part of the polymer backbone. The sulfur moiety may be linear or be part of a cyclic structure with other carbons.

(1)

Examples of such polymers are amongst others, polysulfides, and polyurethanes, polyester, polyamides containing sulfur groups, some of which are shown below in Structures 1a-1d.

(1a)

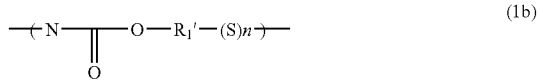

(1b)

(1c)

(1d)

where $R_1'$ is part of the polymer backbone and can be exemplified by alkylene, aryl, aralkyl, and any other typical polymeric unit, and n is an integer equal to or greater than 1. One embodiment of $R_1'$ is alkylene, more specifically methylene. Structure 1a is described in U.S. Pat. No. 4,493,927. Other monomeric unit(s) may also be present to form a copolymer, or the unit can form a homopolymer.

Structure 2 shows a monomeric unit where the sulfur group is pendant from the polymer.

(2)

where W is the backbone unit of the polymer, Y is a connecting group or a direct valence bond, S is sulfur, n an integer greater than or equal to 1, m is an integer greater than or equal to zero, X is a pendant group, and optionally X and Y may be combined to form a cyclic structure. The sulfur group may be connected directly to the polymer backbone, W, or through a connecting group, Y. The backbone unit may be a substituted or unsubstituted alkylene group, siloxane, titanates, or a substituted or unsubstituted alicyclic group. The connecting group, Y, may be any organic moiety that connects the sulfur group with the polymer backbone and may be exemplified by an ester, alicyclic group, ether, alkylene, alkene, alkyne, etc. FIG. 2 gives example of Y groups. Examples of the polymer comprising the backbone unit and the connecting group, W, are given in FIG. 3. The sulfur moiety pendant from the polymer may be the end group itself, or may further be attached to another group, X, where X may be hydrogen, ether, ester, alkyne, etc. FIG. 4 describes some end groups, X. FIG. 5 describes some polymers that can be used.

The sulfur moiety may also be cyclic attached directly to the polymer or through other cyclic alkylenes as shown in Structure 3a, 3b and 3c, where Y and n are as described previously. Cyclic alkylenes may be exemplified amongst others by cyclohexene, adamantane and norbornane.

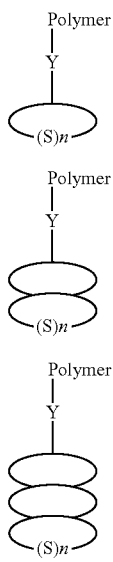

3(a)

3(b)

3(c)

The cyclic ring or rings comprising the sulfur moiety may also comprise the backbone of the polymer, as shown in Structures 3d, 3e and 3f, where the cyclic sulfur is present in the polymer backbone or pendant from the cyclic structures, such as cyclic alkylenes.

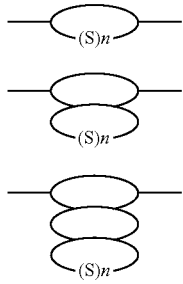

3(g)

3(f)

3(g)

Some examples of cyclic structures containing sulfur are shown in Structures (5a-5c). Examples of cyclic sulfur monomeric structures are given in Structure 4a-4d, where these monomers may form homopolymers or be copolymerized with other monomers.

(4a)

(4b)

(4c)

(4d)

Where Z =

(5a)

(5b)

(5c)

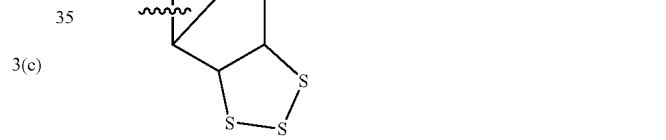

and Q is known as hydrolytic condensation moieties known in the synthesis of silicones such as $ZSi(OH)_3$, $ZSiCl_3$, silane ester $ZSi(OR_x)_3$, acyloxy $ZSi(OCO\ alkyl)_3$), or oxime $ZSi(alkylketoxime)_3$.

In one embodiment of the polymer comprising $-(S)_n-$ described above, n is greater than 1, and in another embodiment n is in the range of 2-4.

The polymer of the antireflective coating may also comprise as the functional group which increases the refractive index, a sulfone group, which may be in the backbone of the polymer or pendant from the polymer backbone. Structure 6a shows where the sulfone is present in the backbone and Structure 6b shows where the sulfone group is pendant from the polymer backbone.

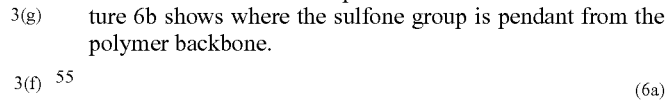
(6a)

(6b)

where $R_1'$ is part of the polymer backbone as above and can be exemplified by alkylene, phenylene and cyclohexene, and where W is the backbone unit of the polymer, Y is a connecting group or a direct valence bond, n is an integer greater than or equal to 1, m is an integer greater than or equal to zero, X is a pendant group, and optionally X and Y may be combined to form a cyclic structure. Analogous structures as shown for sulfur containing polymers above may be used for sulfone containing polymers, where sulfone is substituted for sulfur.

The polymer of the antireflective coating may also comprise as the functional group which increases the refractive index, a halide group, such as chloride, bromide and iodide, which is attached directly to the polymer backbone or attached to a group pendant from the polymer backbone. Some monomeric units are described in FIG. 6. The polymer can be exemplified by Structures (7a-7e) in FIG. 6. The halides can replace the hydrogen or alkyl group in any of the polymeric structures.

Generally antireflective coating compositions comprising polymers with sulfur moieties, such as sulfide and sulfone, as the functionality that increases the refractive index of the compositions, are preferred for compatibility with the device manufacturing process. In one embodiment of the functionality that increases the refractive index of the composition, a polymer comprising a sulfide moiety is preferred.

The refractive index of polymers is usually measured at long wavelengths, such as 630 nm or 589 nm, since it is easier to do so. It is known that as the wavelength decreases the refractive index will increase for almost all polymers, as shown in FIGS. 7 and 8. Anomalous dispersion caused by absorption at the exposure wavelength can modulate the refractive index curve around the exposure wavelength. However, if the absorption (k) is kept at less than 0.3, then the effect of anomalous dispersion has less negative impact on the refractive index, but may increase the refractive index somewhat. Thus if a polymer has a given value of refractive index at long wavelengths (500-600 nm) then this refractive index will be higher at wavelengths less than 300 nm, which is useful for antireflective coatings used in immersion lithography. Therefore, the increase in the refractive index measured at long wavelengths for polymers will always give an even higher value at shorter wavelengths, such as 193 nm. An increase in refractive index of one polymer over another polymer at long wavelengths will be amplified to a greater extent at wavelengths less than 300 nm. The increase of refractive index at long wavelengths can be used as a predictor of which functionalities will also increase the refractive index at shorter wavelengths. FIGS. 7 and 8 show the increase in refractive index of polymers with sulfur groups and halides as compared to conventional polymers containing carbon, hydrogen and oxygen.

The refractive index of the composition can be adjusted by changing in the polymer the concentration of the functionality that increases the refractive index, which is, increasing the concentration of the functionality increases the refractive index.

In the polymer, the functionality comprising the absorbing chromophore may be one which absorbs the radiation used to expose the photoresist, and such chromophore groups can be exemplified by aromatic functionalities or heteroaromatic functionalities. Further examples of the chromophore are without limitation, a substituted or unsubstituted phenyl group, a substituted or unsubstituted anthracyl group, a substituted or unsubstituted phenanthryl group, a substituted or unsubstituted naphthyl group, a sulfone-based compound, benzophenone-based compound, a substituted or an unsubstituted heterocyclic aromatic ring containing heteroatoms selected from oxygen, nitrogen, sulfur; and a mixture thereof. Specifically, the chromophore functionality can be bisphenylsulfone-based compounds, naphthalene or anthracene based compounds having at least one pendant group selected from hydroxy group, carboxyl group, hydroxyalkyl group, alkyl, alkylene, etc. Examples of the chromophore moiety are also given in US 2005/0058929. More specifically the chromophore may be phenyl, benzyl, hydroxyphenyl, 4-methoxyphenyl, 4-acetoxyphenyl, t-butoxyphenyl, t-butylphenyl, alkylphenyl, chloromethylphenyl, bromomethylphenyl, 9-anthracene methylene, 9-anthracene ethylene, 9-anthracene methylene, and their equivalents. In one embodiment of the chromophore group in the polymer, a substituted or unsubstituted phenyl group is used, such as phenyl, benzyl, hydroxyphenyl, 4-methoxyphenyl, 4-acetoxyphenyl, t-butoxyphenyl, t-butylphenyl, alkylphenyl, chloromethylphenyl, and bromomethylphenyl. The concentration of the chromophore moiety in the polymer is kept at a sufficient level to give an extinction coefficient (k) of less than 0.3 in the upper layer antireflective coating which is in contact with the photoresist.

The functionality in the polymer used to adjust the etch rate of the antireflective coating may comprise moieties that increase the etch rate or moieties that decrease the etch rate. Moieties that increase the etch rate under reactive ion oxygen conditions are oxygen containing groups such as ethers, esters, ketones, aldehydes, carboxylic acids, amines, urethanes, etc., where these functionalities may be pendant from the polymer or are in the backbone of the polymer. Moieties that reduce the etch rate under reactive ion oxygen conditions can be groups that contain silicon. Silicon may be present in the polymer generally known as siloxanes. Siloxane and silsesquioxane polymers which can be used as the backbone of the polymer are known and disclosed in the U.S. patent application with the Ser. Nos. 11/425,813 and 11/425,817, and to these the functionalities that increase the refractive index, functionalities that are absorbing and functionalities that are crosslinking, described above may be attached. Thus siloxane or silsesquioxane polymers may have pendant moieties used to increase refractive index such as those described previously, chromophores containing moiety described previously or a combination of these. The moiety used to increase refractive index may be sulfur based, such as those comprising sulfide or sulfone described previously. A siloxane polymeric unit may be exemplified by comprising at least one repeating unit derived from a monomer of formula $((A)_j R_{11} SiO_{(3-j)/2})$, where $R_{11}$ is selected from the moiety with the high refractive index described previously; A is an unreacted functional group of a monomer which forms either of the above repeating units; and j falls within the range $0 \leq j \leq 1$. A siloxane polymer may also be described by the structure, $(R^1 SiO_{3/2})_a (R^2 SiO_{3/2})_b (R^3 SiO_{3/2})_c (SiO_{4/2})_d (R^4 R^5 SiO)_e$, where, $R^1$ is a moiety comprising a crosslinking group, $R^2$ is a moiety comprising a chromophore group, $R^3$, $R^4$ and/or $R^5$ are independently selected from the moiety with the high refractive index described previously and a hydrocarbon moiety, $0 < a < 1$; $0 < b < 1$, $0 \leq c < 1$; $0 \leq d < 1$; and $a+b+c+d=1$. Other variations of these types of polymers may also be used.

By analogy, the chemistry involved in sol-gel processes is based on the hydrolysis and condensation reactions of metallo-organic compounds such as metal alkoxides (Metal $(OR_{12})_p$) or metal halogenide $(Metal(Ha)_p)$ leading to the formation of metal oxo-polymers, where $R_{12}$ is an alkyl group, $2 < p < 4$, Ha is a halogen atom and the metal is preferably selected from the group consisting of germanium titianium, tin, antimony, tantalum, hafnium and zirconium. Thus combination of metals other than Si, such as titanium analogs, would work as hybrids with the siloxanes or by themselves. A procedure for making suck hybrid metal materials can be found in patent patent US 2005/0277274 A1.

Polyphosphazene, —P=N—, type of polymer having a high refractive index may be used and may further comprise a chromophore and a crosslinking group described herein.

In the above definitions and throughout the present specification, unless otherwise stated the terms used are described below.

Alkyl means linear or branched alkyl having the desirable number of carbon atoms and valence. The alkyl group is generally aliphatic and may be cyclic or acyclic (i.e. noncyclic). Suitable acyclic groups can be methyl, ethyl, n-or iso-propyl, n-iso, or tert-butyl, linear or branched pentyl, hexyl, heptyl, octyl, decyl, dodecyl, tetradecyl and hexadecyl. Unless otherwise stated, alkyl refers to 1-20 carbon atom moeity. The cyclic alkyl groups may be mono cyclic or polycyclic. Suitable example of mono-cyclic alkyl groups include substituted cyclopentyl, cyclohexyl, and cycloheptyl groups. The substituents may be any of the acyclic alkyl groups described herein. Suitable bicyclic alkyl groups include substituted bicycle[2.2.1]heptane, bicyclo[2.2.2]octane, bicyclo[3.2.1]octane, bicyclo[3.2.2]nonane, and bicyclo[3.3.2]decane, and the like. Examples of tricyclic alkyl groups include tricyclo[5.4.0.0.2,9]undecane, tricyclo[4.2.1.2.7,9]undecane, tricyclo[5.3.2.0.4,9]dodecane, and tricyclo[5.2.1.0.2,6] decane. As mentioned herein the cyclic alkyl groups may have any of the acyclic alkyl groups as substituents.

Alkylene groups are divalent alkyl groups derived from any of the alkyl groups mentioned hereinabove. When referring to alkylene groups, these include an alkylene chain substituted with ($C_1$-$C_6$) alkyl groups in the main carbon chain of the alkylene group. Alkylene groups can also include one or more alkyne or alkene groups in the alkylene moiety, where alkyne refers to a triple bond and alkene refers to double bond. Essentially an alkylene is a divalent hydrocarbon group as the backbone. Accordingly, a divalent acyclic group may be methylene, 1,1- or 1,2-ethylene, 1,1-, 1,2-, or 1,3 propylene, 2,5-dimethyl-2,5-hexene, 2,5-dimethyl-2,5-hex-3-yne, and so on. Similarly, a divalent cyclic alkyl group may be 1,2- or 1,3-cyclopentylene, 1,2-, 1,3-, or 1,4-cyclohexylene, and the like. A divalent tricyclo alkyl groups may be any of the tricyclic alkyl groups mentioned herein above.

Aryl or aromatic groups contain 6 to 24 carbon atoms including phenyl, tolyl, xylyl, naphthyl, anthracyl, biphenyls, bis-phenyls, tris-phenyls and the like. These aryl groups may further be substituted with any of the appropriate substituents e.g. alkyl, alkoxy, acyl or aryl groups mentioned hereinabove. Similarly, appropriate polyvalent aryl groups as desired may be used in this invention. Representative examples of divalent aryl groups include phenylenes, xylylenes, naphthylenes, biphenylenes, and the like.

Alkoxy means straight or branched chain alkoxy having 1 to 20 carbon atoms, and includes, for example, methoxy, ethoxy, n-propoxy, isopropoxy, n-butoxy, isobutoxy, tert-butoxy, pentyloxy, hexyloxy, heptyloxy, octyloxy, nonanyloxy, decanyloxy, 4-methylhexyloxy, 2-propylheptyloxy, and 2-ethyloctyloxy.

Aralkyl means aryl groups with attached substituents. The substituents may be any such as alkyl, alkoxy, acyl, etc. Examples of monovalent aralkyl having 7 to 24 carbon atoms include phenylmethyl, phenylethyl, diphenylmethyl, 1,1- or 1,2-diphenylethyl, 1,1-, 1,2-, 2,2-, or 1,3-diphenylpropyl, and the like. Appropriate combinations of substituted aralkyl groups as described herein having desirable valence may be used as a polyvalent aralkyl group.

Alkylenearyl means an aliphatic alkylene moeity with pendant aryl groups. Examples are 1-phenyl-1,2-ethylene and 1-phenylpropylene.

Furthermore, and as used herein, the term "substituted" is contemplated to include all permissible substituents of organic compounds. In a broad aspect, the permissible substituents include acyclic and cyclic, branched and unbranched, carbocyclic and heterocyclic, aromatic and non-aromatic substituents of organic compounds. Illustrative substituents include, for example, those described hereinabove. The permissible substituents can be one or more and the same or different for appropriate organic compounds. For purposes of this invention, the heteroatoms such as nitrogen may have hydrogen substituents and/or any permissible substituents of organic compounds described herein which satisfy the valencies of the heteroatoms. This invention is not intended to be limited in any manner by the permissible substituents of organic compounds.

The polymer of the present invention may be made from any known methods, such as free radical polymerization, ionic polymerization, heterogeneous catalysis and condensation (silicones) etc. The polymerization may be carried out in a solvent, emulsion, metal catalysis, and other known techniques. The proportion of the various functionalities described previously, those to increase refractive index, those to absorb the exposure radiation, those to adjust etch rate, those to crosslink the polymer, etc. are adjusted in the polymer to give the desired lithographic performance. The polymer may comprise other monomeric units, such as cyclic anhydrides, (meth)acrylates, alkylenes, monocyclic units, multicyclic units, etc. Examples of other monomers used to form the polymer are maleic anhydride, cycloolefins, vinyl carboxylic acids, vinyl alcohols, isocycantes, thiols, and hybrid monomers such as silanols, silanes esters, acyloxy silianes, and ketooxime silanes.

The weight average molecular weight (Mw) of the polymer may range from about 1500 to about 180,000, preferably from about 4,000 to about 60,000 and more preferably from about 10,000 to about 30,000. When the weight average molecular weight is below 1,000, then good film forming properties are not obtained for the antireflective coating and when the weight average molecular weight is too high, then properties such as solubility, storage stability and the like may be compromised.

The antireflective coating composition comprises a polymer, a crosslinking agent, an acid generator, and a solvent composition.

A variety of crosslinking agents can be used in the composition of the present invention. Any suitable crosslinking agents that can crosslink the polymer in the presence of an acid may be used. Examples, without limitation, of such crosslinking agents are resins containing melamines, methylols, glycoluril, polymeric glycolurils, benzoguanamine, urea, hydroxy alkyl amides, epoxy and epoxy amine resins, blocked isocyanates, and divinyl monomers. Monomeric melamines like hexamethoxymethyl melamine; glycolurils like tetrakis(methoxymethyl)glycoluril; and aromatic methylols, like 2,6 bishydroxymethyl p-cresol may be used. Crosslinking agents disclosed in US 2006/0058468 and incorporated herein by reference, where the crosslinking agent is a polymer obtained by reacting at least one glycoluril compound with at least one reactive compound containing at least one hydroxy group and/or at least one acid group may be used.

The thermal acid generator (TAG) used in the present invention may be any one or more that upon heating generates an acid which can react with the polymer and propagate crosslinking of the polymer present in the invention, particularly preferred is a strong acid such as a sulfonic acid. Preferably, the thermal acid generator is activated at above 90° C. and more preferably at above 120° C., and even more preferably at above 150° C. The photoresist film is heated for a sufficient length of time to react with the coating. Examples of thermal acid generators are metal-free iodonium and sulfonium salts. Other examples of TAGs are nitrobenzyl tosylates, such as 2-nitrobenzyl tosylate, 2,4-dinitrobenzyl tosylate, 2,6-dinitrobenzyl tosylate, 4-nitrobenzyl tosylate; benzenesulfonates such as 2-trifluoromethyl-6-nitrobenzyl 4-chlorobenzenesulfonate, 2-trifluoromethyl-6-nitrobenzyl 4-nitro benzenesulfonate; phenolic sulfonate esters such as phenyl, 4-methoxybenzenesulfonate; alkyl ammonium salts of organic acids, such as triethylammonium salt of 10-camphorsulfonic acid. Iodonium salts can be exemplified by iodonium fluorosulfonates, iodonium tris(fluorosulfonyl)methide, iodonium bis(fluorosulfonyl)methide, iodonium bis(fluorosulfonyl)imide, iodonium quaternary ammonium fluorosulfonate, iodonium quaternary ammonium tris(fluorosulfonyl) methide, and iodonium quaternary ammonium bis (fluorosulfonyl)imide. A variety of aromatic (anthracene, naphthalene or benzene derivatives) sulfonic acid amine salts can be employed as the TAG, including those disclosed in U.S. Pat. Nos. 3,474,054, 4,200,729, 4,251,665 and 5,187, 019. Preferably the TAG will have a very low volatility at temperatures between 170-220° C. Examples of TAGs are those sold by King Industries under Nacure and CDX names. Such TAG's are Nacure 5225, and CDX-2168E, which is a dodecylbenzene sulfonic acid amine salt supplied at 25-30% activity in propylene glycol methyl ether from King Industries, Norwalk, Conn. 06852, USA.

The novel composition may further contain a photoacid generator, examples of which without limitation, are onium salts, sulfonate compounds, nitrobenzyl esters, triazines, etc. The preferred photoacid generators are onium salts and sulfonate esters of hydoxyimides, specifically diphenyl iodnium salts, triphenyl sulfonium salts, dialkyl iodonium salts, triakylsulfonium salts, and mixtures thereof.

The amount of the polymer in the present composition can vary from about 95 weight % to about 50 weight %, preferably about 85 weight % to about 70 weight % and more preferably about 80 weight % to about 70 weight %, relative to the solid portion of the composition. The amount of the crosslinker in the present composition can vary from 5 weight % to about 50 weight %, preferably 15 weight % to about 30 weight % relative to the solid portion of the composition. The amount of the acid generator in the present composition can vary from 0.1 weight % to about 5 weight %, preferably 0.5 weight % to about 3 weight % and more preferably 1 weight % to about 2 weight %, relative to the solid portion of the composition.

The solid components of the antireflection coating composition are mixed with a solvent or mixtures of solvents that dissolve the solid components of the antireflective coating. Suitable solvents for the antireflective coating composition may include, for example, a glycol ether derivative such as ethyl cellosolve, methyl cellosolve, propylene glycol monomethyl ether, diethylene glycol monomethyl ether, diethylene glycol monoethyl ether, dipropylene glycol dimethyl ether, propylene glycol n-propyl ether, or diethylene glycol dimethyl ether; a glycol ether ester derivative such as ethyl cellosolve acetate, methyl cellosolve acetate, or propylene glycol monomethyl ether acetate; carboxylates such as ethyl acetate, n-butyl acetate and amyl acetate; carboxylates of di-basic acids such as diethyloxylate and diethylmalonate; dicarboxylates of glycols such as ethylene glycol diacetate and propylene glycol diacetate; and hydroxy carboxylates such as methyl lactate, ethyl lactate, ethyl glycolate, and ethyl-3-hydroxy propionate; a ketone ester such as methyl pyruvate or ethyl pyruvate; an alkoxycarboxylic acid ester such as methyl 3-methoxypropionate, ethyl 3-ethoxypropionate, ethyl 2-hydroxy-2-methylpropionate, or methylethoxypropionate; a ketone derivative such as methyl ethyl ketone, acetyl acetone, cyclopentanone, cyclohexanone or 2-heptanone; a ketone ether derivative such as diacetone alcohol methyl ether; a ketone alcohol derivative such as acetol or diacetone alcohol; lactones such as butyrolactone; an amide derivative such as dimethylacetamide or dimethylformamide, anisole, and mixtures thereof.

The antireflective coating composition comprises the polymer, crosslinker and acid generator of the instant invention and a suitable solvent or mixtures of solvents. Other components may be added to enhance the performance of the coating, e.g. monomeric dyes, lower alcohols, surface leveling agents, adhesion promoters, antifoaming agents, etc. Other secondary polymers, such as, polymethylmethacrylate and polyarylates may be added to the composition, providing the performance is not negatively impacted. These secondary polymers may be used to adjust the extinction coefficient (k) to a desired value. Preferably the amount of this polymer is kept below 50 weight % of the total solids of the composition, more preferably 20 weight %, and even more preferably below 10 weight %.

The optical characteristics of the antireflective coating are optimized for the exposure wavelength and other desired lithographic characteristics. As an example the absorption parameter (k) of the novel composition used as an upper layer in a mutlilayer BARC scheme for 193 nm exposure ranges from about 0.1 to about 0.3 as measured using ellipsometry. The value of the refractive index (n) ranges from about 1.8 to about 2.5, preferably from about 1.85 to about 2.3, and more preferably from about 1.9 to about 2.1 Antireflective films of the order of about 10 nm to about 300 nm may be used. This is particularly advantageous when using a nonaromatic photoresist, such as those sensitive at 193 nm, 157 nm and lower wavelengths, where the photoresist films are thin and must act as an etch mask for the antireflective film. Since the antireflective film is coated on top of the substrate and is further subjected to dry etching, it is envisioned that the film is of sufficiently low metal ion level and of sufficient purity that the properties of the semiconductor device are not adversely affected. Treatments such as passing a solution of the polymer through an ion exchange column, filtration, and extraction processes can be used to reduce the concentration of metal ions and to reduce particles.

The antireflective coating composition is coated on the substrate using techniques well known to those skilled in the art, such as dipping, spin coating or spraying. The film thickness of the antireflective coating ranges from about 15 nm to about 200 nm. The coating is further heated on a hot plate or convection oven for a sufficient length of time to remove any residual solvent and induce crosslinking, and thus insolubilizing the antireflective coating to prevent intermixing between the antireflective coatings. The preferred range of temperature is from about 90° C. to about 250° C. If the temperature is below 90° C. then insufficient loss of solvent or insufficient amount of crosslinking takes place, and at temperatures above 300° C. the composition may become chemically unstable. Multiple layers of antireflective coatings with different optical properties of n and k and different film thickness may be used. The uppermost antireflective coating layer has the highest refractive index, and is the novel antireflective coating layer formed from the composition of the present invention. A film of photoresist is then coated on top of the uppermost antireflective coating and baked to substantially remove the photoresist solvent. An edge bead remover may be applied after the coating steps to clean the edges of the substrate using processes well known in the art.

The substrates over which the antireflective coating or coatings are formed can be any of those typically used in the semiconductor industry. Suitable substrates include, without limitation, silicon, silicon substrate coated with a metal surface, copper coated silicon wafer, copper, substrate coated with antireflective coating, aluminum, polymeric resins, silicon dioxide, metals, doped silicon dioxide, silicon nitride, tantalum, polysilicon, ceramics, aluminum/copper mixtures; gallium arsenide and other such Group III/V compounds. The substrate may comprise any number of layers made from the materials described above.

Photoresists can be any of the types used in the semiconductor industry, provided the photoactive compound in the photoresist and the antireflective coating absorb at the exposure wavelength used for the imaging process.

To date, there are several major deep ultraviolet (uv) exposure technologies that have provided significant advancement in miniaturization, and these radiation of 248 nm, 193 nm, 157 and 13.5 nm. The present invention is useful for imaging at wavelengths below 200 nm. Photoresists for 248 nm have typically been based on substituted polyhydroxystyrene and its copolymers/onium salts, such as those described in U.S. Pat. No. 4,491,628 and U.S. Pat. No. 5,350,660. On the other hand, photoresists for exposure below 200 nm require non-aromatic polymers since aromatics are opaque at this wavelength. U.S. Pat. No. 5,843,624 and U.S. Pat. No. 6,866,984 disclose photoresists useful for 193 nm exposure. Generally, polymers containing alicyclic hydrocarbons are used for photoresists for exposure below 200 nm. Alicyclic hydrocarbons are incorporated into the polymer for many reasons, primarily since they have relatively high carbon to hydrogen ratios which improve etch resistance, they also provide transparency at low wavelengths and they have relatively high glass transition temperatures. U.S. Pat. No. 5,843,624 discloses polymers for photoresist that are obtained by free radical polymerization of maleic anhydride and unsaturated cyclic monomers. Any of the known types of 193 nm photoresists may be used, such as those described in U.S. Pat. No. 6,447,980 and U.S. Pat. No. 6,723,488, and incorporated herein by reference.

Two basic classes of photoresists sensitive at 157 nm, and based on fluorinated polymers with pendant fluoroalcohol groups, are known to be substantially transparent at that wavelength. One class of 157 nm fluoroalcohol photoresists is derived from polymers containing groups such as fluorinated-norbornenes, and are homopolymerized or copolymerized with other transparent monomers such as tetrafluoroethylene (U.S. Pat. No. 6,790,587, and U.S. Pat. No. 6,849,377) using either metal catalyzed or radical polymerization. Generally, these materials give higher absorbencies but have good plasma etch resistance due to their high alicyclic content. More recently, a class of 157 nm fluoroalcohol polymers was described in which the polymer backbone is derived from the cyclopolymerization of an asymmetrical diene such as 1,1,2,3,3-pentafluoro-4-trifluoromethyl-4-hydroxy-1,6-heptadiene (Shun-ichi Kodama et al Advances in Resist Technology and Processing XIX, Proceedings of SPIE Vol. 4690 p 76 2002; U.S. Pat. No. 6,818,258) or copolymerization of a fluorodiene with an olefin (WO 01/98834-A1). These materials give acceptable absorbance at 157 nm, but due to their lower alicyclic content as compared to the fluoro-norbornene polymer, have lower plasma etch resistance. These two classes of polymers can often be blended to provide a balance between the high etch resistance of the first polymer type and the high transparency at 157 nm of the second polymer type. Photoresists that absorb extreme ultraviolet radiation (EUV) of 13.5 nm are also useful and are known in the art.

After the coating process, the photoresist is imagewise exposed. The exposure may be done using typical exposure equipment. The exposed photoresist is then developed in an aqueous developer to remove the treated photoresist. The developer is preferably an aqueous alkaline solution comprising, for example, tetramethyl ammonium hydroxide. The developer may further comprise surfactant(s). An optional heating step can be incorporated into the process prior to development and after exposure.

The process of coating and imaging photoresists is well known to those skilled in the art and is optimized for the specific type of resist used. The patterned substrate can then be dry etched with an etching gas or mixture of gases, in a suitable etch chamber to remove the exposed portions of the antireflective film, with the remaining photoresist acting as an etch mask. Various etching gases are known in the art for etching organic antireflective coatings, such as those comprising $CF_4$, $CF_4/O_2$, $CF_4/CHF_3$, $O_2$ or $Cl_2/O_2$.

Each of the documents referred to above are incorporated herein by reference in its entirety, for all purposes. The following specific examples will provide detailed illustrations of the methods of producing and utilizing compositions of the present invention. These examples are not intended, however, to limit or restrict the scope of the invention in any way and should not be construed as providing conditions, parameters or values which must be utilized exclusively in order to practice the present invention

EXAMPLES

Example 1

Table 1 shows the refractive index of at 589 nm of various polymers with and without groups that increase the refractive index. It can be seen that conventional hydrocarbon types of polymers give a refractive index in the range of 1.4 to 1.5. Polymers comprising sulfur increase the refractive index to about 1.6 and higher. The greater the molar concentration of the sulfur, chloro, bromo or iodo group, the higher the refractive index. At shorter wavelengths, the refractive index is even higher. Thus incorporating groups such as sulfur, chloro, bromo or iodo would increase the refractive index of an antireflective coating composition at the exposure wavelength. The antireflective coating is made by formulating a solution comprising the polymer which comprises sulfur, chloro, bromo or iodo groups, a crosslinking and an absorbing chromophore, a crosslinking compound, a thermal acid generator and a solvent composition. The composition can be made and imaged as described in Comparative Formulation Example 2.

TABLE 1

| Polymer | Polarizable elements in polymer | | | | Refractive Index* |
|---|---|---|---|---|---|
| | none | S | Cl | Br | |
| Poly(methyl hexyl siloxane) | ✓ | | | | 1.443 |
| Poly(isobutyl methacrylate) | ✓ | | | | 1.447 |
| Poly(ethylene oxide) | ✓ | | | | 1.4539 |
| Polyethylene, low density | ✓ | | | | 1.51 |
| Poly(vinyl chloroacetate) | | | ✓ | | 1.513 |

TABLE 1-continued

| Polymer | Polarizable elements in polymer | | | | Refractive Index* |
|---|---|---|---|---|---|
| | none | S | Cl | Br | |
| Poly(2-chloroethyl methacrylate) | | | ✓ | | 1.517 |
| Poly(1,3-dichloropropyl methacrylate) | | | ✓ | | 1.527 |
| Poly(methyl m-chlorophenyl siloxane) | | | ✓ | | 1.56 |
| Poly{2-(phenylsulfonyl)ethyl methacrylate} | | ✓ | | | 1.5682 |
| Poly(2,3-dibromopropyl methacrylate) | | | | ✓ | 1.5739 |
| Polystyrene | ✓ | | | | 1.5894 |
| Poly(propylene sulfide) | | ✓ | | | 1.596 |
| Poly(p-bromophenyl methacrylate) | | | | ✓ | 1.5964 |
| Poly(vinylidene chloride) | | | ✓ | | 1.6 |
| Poly{2,2-propane bis[4-(2,6-dichlorophenyl)]carbonate} | | | ✓ | | 1.6056 |
| Poly(pentachlorophenyl methacrylate) | | | ✓ | | 1.608 |
| Poly(2-chlorostyrene) | | | ✓ | | 1.6098 |
| Poly(phenyl alpha-bromoacrylate) | | | | ✓ | 1.612 |
| Poly(2,6-dichlorostyrene) | | | ✓ | | 1.6248 |
| Poly(chloro-p-xylene) | | | ✓ | | 1.629 |
| Poly(p-phenylene ether-sulphone) | | ✓ | | | 1.65 |
| Poly(styrene sulfide) | | ✓ | | | 1.6568 |
| Poly(pentabromophenyl methacrylate) | | | | ✓ | 1.71 |

*taken from http://www.texloc.com/closet/cl_refractiveindex.html. Presumably derived at 20° C. at wavelength of 589 nm (Na D line)

Comparative Synthetic Example 1

A three-neck 500 mL round-bottom flask, equipped with a magnetic stirrer, thermometer and condenser, was charged with 136.1 g of 2-(3,4-epoxycyclohexyl)ethyl-trimethoxysilane (552 mmol), 68.0 g of phenyltrimethoxysilane (343 mmol), and 136.0 g of methyltrimethoxysilane (1.0 mol). To the flask, was added a mixture of 43.0 g of deionized water (DI) water, 18.0 g of acetic acid, and 127 g of isopropanol. The mixture was heated to reflux and kept at that temperature for 3 hours. Then, the mixture was cooled to room temperature. The solvents were removed under reduced pressure to afford 258.7 g of a colorless liquid polymer with the units shown below. The weight average molecular weight was approximately 7,700 g/mol, determined by gel permeation chromatography using polystyrenes as references.

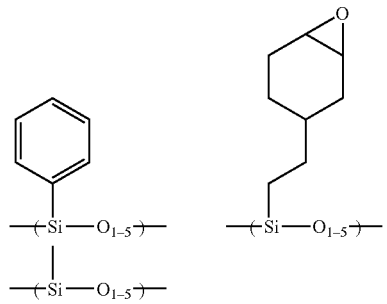

Comparative Formulation Example 1

200 g of the epoxy siloxane polymer prepared in Example 1 and 7.0 g of diphenyliodonium perfluoro-1-butanesulfonate was dissolved in a mixture of propylene glycol monomethyl ether acetate (PGMEA) and propylene glycol monomethyl ether (PGME) (70/30 PGMEA/PGME) to achieve 6.3 wt. % of total solids and filtered. This homogeneous solution was spin-coated on a silicon wafer at 1200 rpm. The coated wafer was baked on hotplate at 250° C. for 90 seconds. Then, n and k values were measured with a VASE Ellipsometer manufactured by J. A. Woollam Co. Inc. The optical constants n and k of the Si-containing film for 193 nm radiation were 1.668 and 0.180 respectively.

Synthetic Example 1

A three-neck 500 mL round-bottom flask, equipped with a magnetic stirrer, thermometer and condenser, is charged with 136.1 g of 2-(3,4-epoxycyclohexyl)ethyl-trimethoxysilane (552 mmol), 68.0 g of phenyltrimethoxysilane (343 mmol), and 338.0 g of trithiomonomer 1 (1.0 mol). To the flask, is added a mixture of 43.0 g of deionized water (DI) water, 18.0 g of acetic acid, and 127 g of isopropanol. The mixture is heated to reflux and kept at that temperature for 3 hours. Then, the mixture is cooled to room temperature. The solvents are removed under reduced pressure to afford 258.7 g of a colorless liquid polymer. The weight average molecular weight was approximately 7,700 g/mol, determined by gel permeation chromatography using polystyrenes as references.

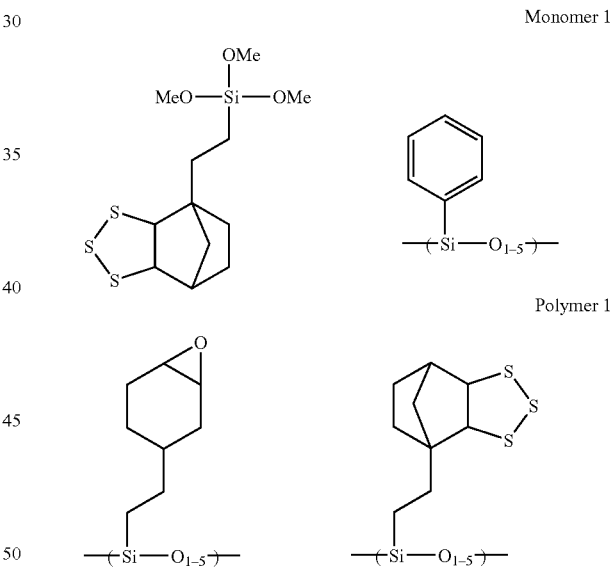

Formulation Example 1

200 g of the epoxy siloxane polymer prepared in synthetic example 1 and 7.0 g of diphenyliodonium perfluoro-1-butanesulfonate is dissolved in a mixture of propylene glycol monomethyl ether acetate (PGMEA) and propylene glycol monomethyl ether (PGME) (70/30 PGMEA/PGME) to achieve 6.3 wt. % of total solids and filtered. This homogeneous solution is spin-coated on a silicon wafer at 1200 rpm. The coated wafer is baked on hotplate at 250° C. for 90 seconds. Then, n and k values can be measured with a VASE Ellipsometer manufactured by J.A. Woollam Co. Inc. The optical constants n and k of the Si-containing film for 193 nm radiation is expected to be 1.868 and 0.180 respectively.

Comparative Synthetic Example 2a 210 g of butanetetracarboxylic acid dianhydride, 36 g of pyromellitic dianhydride, 84 g of styrene glycol, 80.4 g of neopentyl glycol, 3.2 g of benzyltributylammonium chloride, and 1500 g of PGMEA were charged into a 5 L-flask with a condenser, thermal controller and a mechanical stirrer. Under nitrogen and stirring, the mixture was heated to and kept at 100° C. for 16 hrs. Then 760 g of propylene oxide and 3.2 g of benzyltributylammonium chloride were added. The reaction was kept at 56° C. for 36 hrs. The reaction solution was cooled to room temperature and slowly poured into large amount of water in a high speed blender. The polymer was collected and washed thoroughly with water. Finally the polymer was dried in a vacuum oven. 410 g of polymer was obtained with a MW of about 30,000 g/mol.

Comparative Formulation Example 1

An antireflective coating composition was prepared by dissolving 2.4 g of polymer from comparative synthesis example 2a, 1.2 g of polymer from comparative synthesis 2b and 0.048 g triethylammonium salt of 10-camphorsulfonic acid in 180 g PGMEA. The solution was filtered through 0.2 μm filter.

The performance of the anti-reflective coating formulation was evaluated using AZ® EXP AX1120P photoresist (available from AZ® Electronic Materials, Somerville, N.J.). An antireflective film from the above solution was coated on a thin layer AZ® ArF-1C5D BARC (available from AZ Electronic Materials, Somerville, N.J.) on silicon wafer and baked at 200° C. for 90 seconds. The antireflective film was found to have (n) value of 1.77 and (k) value of 0.16. Using AZ® EXP

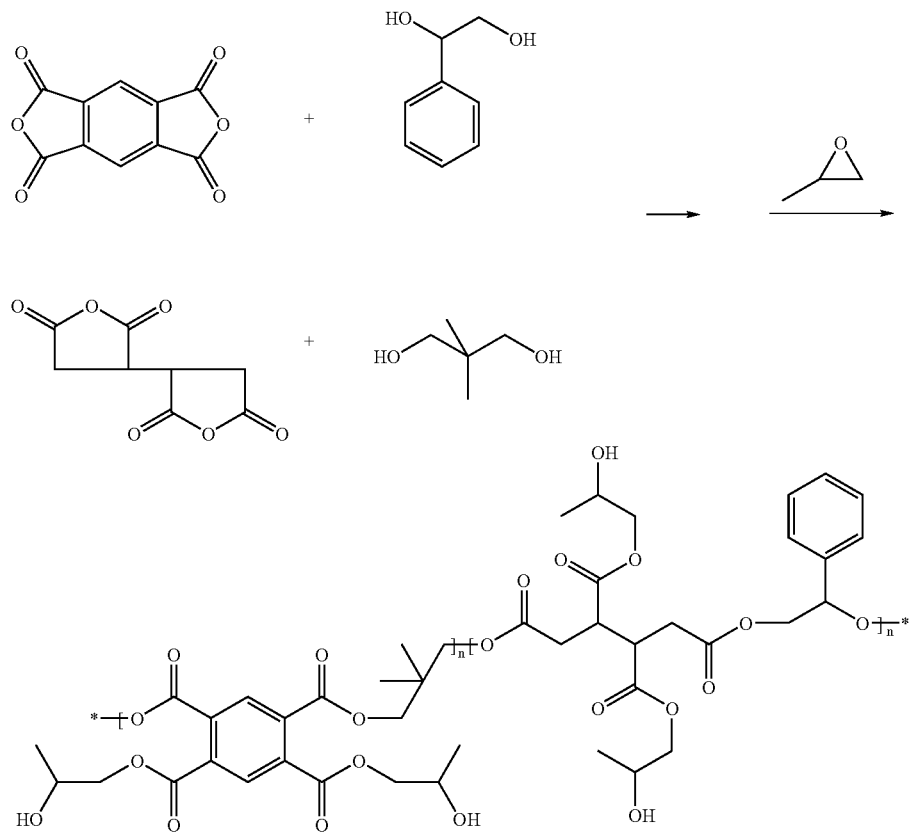

Comparative Synthetic Example 2b 1000 grams of tetramethoxymethyl glycoluril, 500 grams of neopentyl glycol and 3000 grams of PGMEA were charged into a 5000 mL flask with a thermometer, a cold water condenser and a mechanical stirrer. The reaction mixture was heated to 85° C. After a catalytic amount of para-toluenesulfonic acid monohydrate was added, the reaction was maintained at this temperature for 8.0 hours. The reaction solution was then cooled to room temperature and filtered. The polymer was precipitated in DI water and collected on a filter, washed thoroughly with water and dried in a vacuum oven (400 grams were obtained). The polymer obtained had a weight average molecular weight of about 8,000 g/mol and a polydispersity of 3.

AX1120P photoresist a 270 nm film was coated and baked at 130° C. for 60 seconds. The wafer was then imagewise exposed using a 193 nm exposure tool. The exposed wafer was baked at 130° C. for 60 seconds and developed using a 2.38 wt % aqueous solution of tetramethyl ammonium hydroxide for 60 seconds. The line and space patterns when observed under scanning electron microscope showed no standing waves, indicating the efficacy of the bottom antireflective coating.

Synthetic Example 2

210 g of butanetetracarboxylic acid dianhydride, 36 g of pyromellitic dianhydride, 84 g of styrene glycol, 80.4 g of glycol 2, 3.2 g of benzyltributylammonium chloride, and 1500 g of PGMEA is charged into a 5 L-flask with a condenser, thermal controller and a mechanical stirrer. Under nitrogen and stirring, the mixture is heated to and kept at 100° C. for 16 hrs. Then 760 g of propylene oxide and 3.2 g of benzyltributylammonium chloride is added. The reaction is kept at 56° C. for 36 hrs. The reaction solution is cooled to room temperature and slowly poured into large amount of water in a high speed blender. The polymer is collected and washed thoroughly with water. Finally the polymer is dried in a vacuum oven.

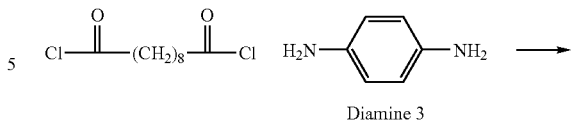

Diamine 3

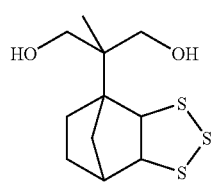

Glycol 2

Polymer 2

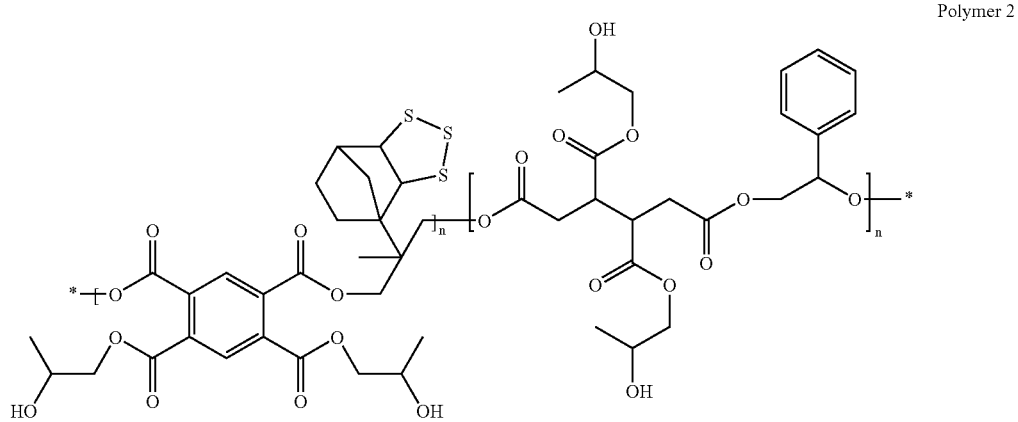

Formulation Example 2

An antireflective coating composition is prepared by dissolving 2.4 g of polymer from synthesis example 2, 0.2 g MX-270 (available from Sanwa Chemical, Hiratsuka-city, Kanagawa, Japan) and 0.048 g triethylammonium salt of 10-camphorsulfonic acid in 180 g PGMEA. The solution was filtered through 0.2 μm filter.

The antireflective film is expected to have (n) value of 1.97 and (k) value of 0.16.

Comparative Synthetic Example 3

10 mL of diamine 3 as a 5% aqueous solution is pored into a 50 mL beaker. 10 drops of 20% sodium hydroxide solution is added with stirring. 10 mL of sebacoyl chloride as a 5% cyclohexane solution is pouring down the wall of the tilted beaker. Two layers will separate and the polymer forms at the interface between the two liquids. Using forceps, the polymer was picked out at the center and slowly drawn to form nylon. The polymer was washed with water before handling.

-continued

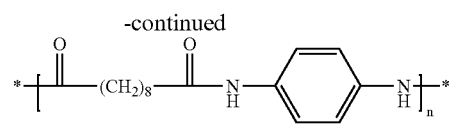

Comparative Formulation Example 3

An antireflective coating composition is prepared by dissolving 10 g of polymer from synthesis example 3, 2 g MX-270 (available from Sanwa Chemical), 2 g dodecylbenzylsulfonium triethylammonium salt (10% solution in PGME), 2 g of p-toluenesulfonic acid triethylammonium salt (10% solution in PGME), and 460 g 70/30 PGMEA/PGME. The solution was filtered through 0.2 μm filter.

Synthetic Example 3

10 mL mixture of diamines 1 and 2 (1:1) as a 5% aqueous solution is pored into a 50 mL beaker. 10 drops of 20% sodium hydroxide solution is added with stirring. 10 mL of sebacoyl chloride as a 5% cyclohexane solution is pouring down the wall of the tilted beaker. Two layers will separate and the polymer forms at the interface between the two liquids. Using forceps, the polymer was picked out at the center and slowly drawn to form nylon. The polymer was washed with water before handling.

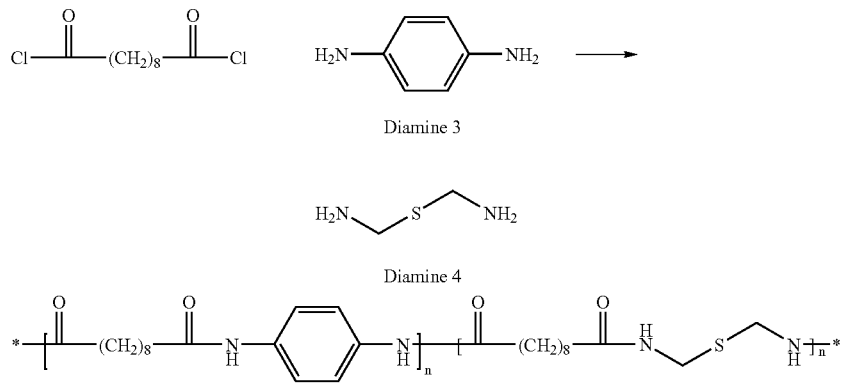

Diamine 3

Diamine 4

Formulation Example 3

An antireflective coating composition is prepared by dissolving 10 g of polymer from synthesis example 3, 2 g MX-270 (available from Sanwa Chemical), 2 g dodecylbenzylsulfonium triethylammonium salt (10% solution in PGME), 2 g of p-toluenesulfonic acid triethylammonium salt (10% solution in PGME), and 460 g 70/30 PGMEA/PGME. The solution was filtered through 0.2 μm filter.

The antireflective film is expected to have (n) value 0.2 greater than comparative example 3.

Comparative Synthetic Example 4

83.2 g of benzyl methacrylate, 25.8 g of hydroxyethyl methacrylate, 500 ml tetrahydrofuran (THF) and 2 g AIBN were combined, in that order, to a 1 L round bottom flask. The solution was refluxed for 12 hr under nitrogen. After cooling, the polymer was recovered by precipitation into 4 L of hexane, filtered and dried in a vacuum desiccator. The polymer was produced with a 98.5% yield. The reaction scheme for this procedure is shown below.

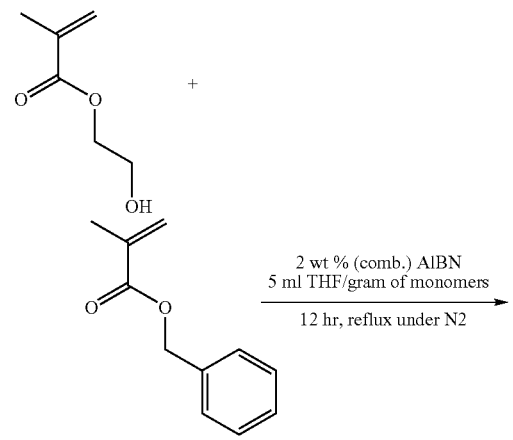

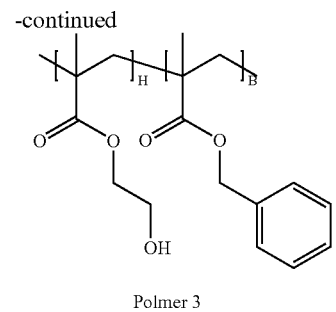

Polmer 3

Comparative Formulations 4

The formulation consists of 9.21 g of polymer 3 copolymer (comparative Example 4), 2.76 g MX-270 (available from Sanwa Chemical), 2 g dodecylbenzylsulfonium triethylammonium salt (10% solution in PGME), 2 g of p-toluenesulfonic acid triethylammonium salt (10% solution in PGME), and 460 g 70/30 PGMEA/PGME. The formulation for this procedure is shown below.

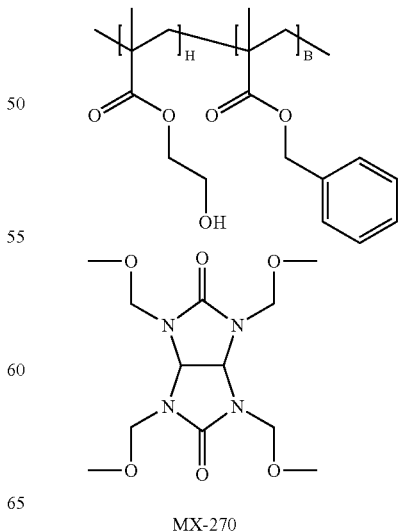

MX-270

-continued

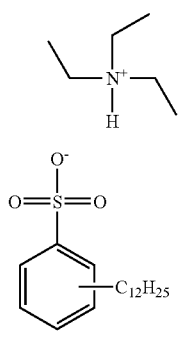

DBSA/Eth3N

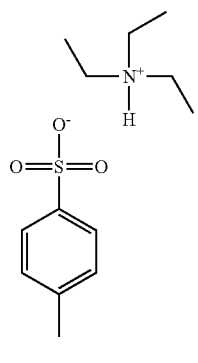

PTSA/Eth3N

Synthetic Example 4

25 g of benzyl methacrylate, 25 g of hydroxyethyl methacrylate, 25 g of sulfide monomer 4,500 ml tetrahydrofuran (THF) and 2 g AIBN is combined, in that order, to a 1 L round bottom flask. The solution is refluxed for 12 hr under nitrogen. After cooling, the polymer is recovered by precipitation into 4 L of hexane, filtered and dried in a vacuum desiccator. The reaction scheme for this procedure is shown below.

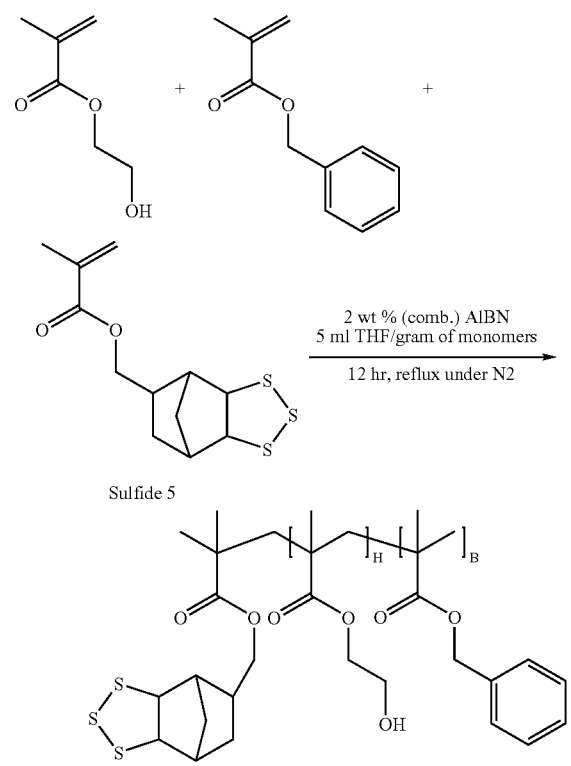

Example Formulations 4

The formulation consist of 9.21 g of copolymer from synthetic example 3, 2.76 g MX-270 (available from Sanwa Chemical), 2 g dodecylbenzylsulfonium triethylammonium salt (10% solution in PGME), 2 g of p-toluenesulfonic acid triethylammonium salt (10% solution in PGME), and 460 g 70/30 PGMEA/PGME. The formulation for this procedure is shown below.

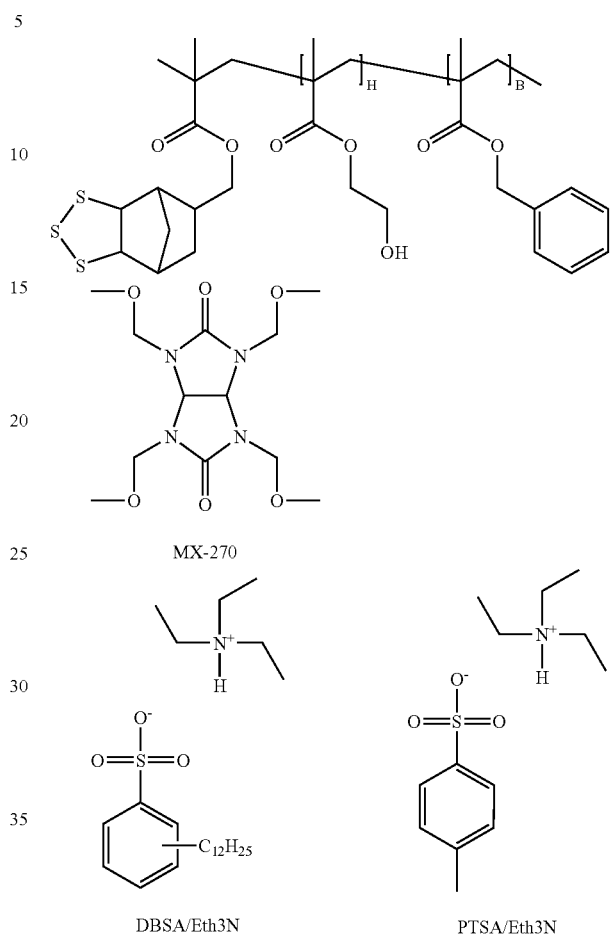

The formulation is processed in the same way as in Comparative Formulation Example 2.

Example Formulation 5

0.05 g Poly(vinyl phenyl sulfide-co-glycidyl methacrylate) from Sigma-Aldrich Co. St. Louis, Mo., was dissolved in 5 mL 70/30 propylenegylcol monomethylether acetate/propylenegylcol monomethylether. After filtering, the solution was spin onto a 4 in silicon wafers at 2000 rpm. Baking caused some fogging of the film so a film which was only coated was used in the VUV-VASE analysis. The variation of the Index of refraction through wavelengths is shown in FIG. 9, where it is clearly evident that the incorporation of sulfide moieties increase the index of refraction especially in non-absorbing areas compared to silicones and organic materials.

Example Formulations 6

0.05 g Poly(2-vinylthiophene) from Aldrich was dissolved in 5 mL 70/30 PGMEA/PGME. After filtering the solution was spun onto 4 inch silicon wafers at 2000 rpm. The film was baked at 250° C. for 60 seconds and then evaluated by VUV-VASE. Index of refraction through wavelength data is exhibited in FIG. 10 where it is clearly evident that the incorporation of sulfide moieties increase the index of refraction especially in non-absorbing areas compared to silicones and organic materials.

Example Formulation 7

0.05 g Poly(pentabromophenyl methacrylate-co-glycidyl methacrylate) from Aldrich was dissolved in 5 mL cyclohexanone. After filtering the solution was spun cOated onto 4 inch silicon wafers at 2000 rpm. Film was baked at 250° C. for 60 seconds and then evaluated by VUV-VASE. Index of refraction through wavelength data is exhibited in FIG. 11 where it is clearly evident that the incorporation of sulfide moieties increase the index of refraction especially in non-absorbing areas compared to silicones and organic materials.

Example Formulations 8

0.05 g Poly(vinyl chloride-co-vinyl acetate-co-2-hydroxypropyl acrylate) from Aldrich was dissolved in 5 mL ethyl lactate. After filtering the solution was spin casted onto 4 in silicon wafers at 2000 rpm. Film was baked at 250° C. for 60 seconds and then evaluated by VUV-VASE. Index of refraction through wavelength data is exhibited in FIG. 12 where it is clearly evident that the incorporation of sulfide moieties increase the index of refraction especially in non-absorbing areas compared to silicones and organic materials.

The invention claimed is:

1. A spin-on antireflective coating composition for a photoresist comprising a polymer, and a thermal acid generator, where the polymer comprises at least one functional moiety capable of increasing refractive index of the antireflective coating composition to a value equal or greater than 1.85 at exposure radiation used for imaging the photoresist and at least one functional moiety capable of absorbing exposure radiation used for imaging the photoresist, and further where the functional moiety capable of increasing the refractive index is —$(S)_n$—, where n is an integer.

2. The antireflective composition of claim 1, where the refractive index is in the range of about 1.85 to about 2.3.

3. A spin-on antireflective coating composition for a photoresist comprising a polymer, and a thermal acid generator, where the polymer comprises at least one functional moiety capable of increasing refractive index of the antireflective coating composition to a value equal or greater than 1.85 at exposure radiation used for imaging the photoresist and at least one functional moiety capable of absorbing exposure radiation used for imaging the photoresist, and further where the functional moiety capable of increasing the refractive index is selected from a halide.

4. The antireflective composition of claim 1, where the functional moiety capable of increasing the refractive index is selected from —(S—S)—, —(S—S—S)—, and —(S—S—S—S)—.

5. The antireflective composition of claim 1, where the composition has an absorption extinction coefficient (k) value of about 0.1 to about 0.3.

6. The antireflective composition of claim 1, where the functional moiety capable of absorbing exposure radiation is selected from compounds containing hydrocarbon aromatic rings, substituted and unsubstituted phenyl, substituted and unsubstituted anthracyl, substituted and unsubstituted phenanthryl, substituted and unsu batituted naphthyl, substituted and unsubstituted heterocyclic aromatic rings containing heteroatoms selected from oxygen, nitrogen, sulfur, or combinations thereof.

7. The antireflective composition of claim 1, where the functional moiety capable of absorbing exposure radiation is selected from substituted and unsubstituted phenyl.

8. The antireflective composition of claim 1, where the polymer further comprises a silicon moiety.

9. The antireflective composition of claim 8, where the silicon moiety is a siloxane.

10. The antireflective composition of claim 1, further comprising a crosslinking agent.

11. The composition of claim 10, where the crosslinking agent is selected from melamines, methylols, glycolurils, polymeric gycolurils, hydroxy alkyl amides, epoxy and epoxy amine resins, blocked isocyanates, and divinyl monomers.

12. The composition of claim 1, where the acid generator is selected from iodonium salts, tosylates, derivatives of benzene sulfonic acid salts, and derivatives of naphthalene sulfonic acid salts.

13. A process for forming an image comprising,
a) coating and baking a substrate with the antireflective coating composition of claim 1;
b) coating and baking a photoresist film on top of the antireflective coating;
c) imagewise exposing the photoresist;
d) developing an image in the photoresist;
e) optionally, baking the substrate after the exposing step.

14. The process of claim 13, where the photoresist is imagewise exposed at wavelengths between about 13.5 nm to about 250 nm.

15. The process of claim 13, where the imagewise exposure uses immersion lithography.

16. The process of claim 15, where numerical aperature of lens in immersion lithography is greater than 1.2.

17. The process of claim 13, where the photoresist comprises a polymer and a photoactive compound.

18. The antireflective composition of claim 1, where the refractive index is in the range of about 1.9 to about 2.1.

19. The antireflective composition of claim 3, where the functional moiety capable of absorbing exposure radiation is selected from compounds containing hydrocarbon aromatic rings, substituted and unsubstituted phenyl, substituted and unsubstituted anthracyl, substituted and unsubstituted phenanthryl, substituted and unsubstituted naphthyl, substituted and unsubstituted heterocyclic aromatic rings containing heteroatoms selected from oxygen, nitrogen, sulfur, or combinations thereof.

20. The antireflective composition of claim 3, further comprising a crosslinking agent.

21. The composition of claim 20, where the crosslinking agent is selected from melamines, methylols, glycolurils, polymeric gycolurils, hydroxy alkyl amides, epoxy and epoxy amine resins, blocked isocyanates, and divinyl monomers.

22. The composition of claim 3, where the acid generator is selected from iodonium salts, tosylates, derivatives of benzene sulfonic acid salts, and derivatives of naphthalene sulfonic acid salts.

* * * * *